(12) United States Patent
Jindal et al.

(10) Patent No.: US 8,865,376 B2
(45) Date of Patent: Oct. 21, 2014

(54) EUVL PROCESS STRUCTURE FABRICATION METHODS

(71) Applicants: Sematech, Inc., Albany, NY (US); Intel Corporation, Santa Clara, CA (US)

(72) Inventors: Vibhu Jindal, Niskayuna, NY (US); Frank Goodwin, Halfmoon, NY (US); Patrick A. Kearney, Wynantskill, NY (US); Eric M. Panning, Hillsboro, OR (US)

(73) Assignees: Sematech, Inc., Albany, NY (US); Intel Corporation, Santa Clara, CA (US)

( * ) Notice: Subject to any disclaimer, the term of this patent is extended or adjusted under 35 U.S.C. 154(b) by 70 days.

(21) Appl. No.: 13/790,288

(22) Filed: Mar. 8, 2013

(65) Prior Publication Data

US 2014/0255828 A1 Sep. 11, 2014

(51) Int. Cl.
*G03F 1/22* (2012.01)
*G03F 1/24* (2012.01)
*G03F 1/68* (2012.01)

(52) U.S. Cl.
USPC ............................................................ 430/5

(58) Field of Classification Search
CPC ................ G03F 1/22; G03F 1/24; G03F 1/68
USPC ................ 430/5, 311, 312, 322, 323; 451/41; 438/693; 378/35
See application file for complete search history.

(56) References Cited

U.S. PATENT DOCUMENTS

| | | | |
|---|---|---|---|
| 5,234,781 A * | 8/1993 | Sakamoto et al. | 430/5 |
| 6,048,652 A | 4/2000 | Nguyen et al. | |
| 6,368,942 B1 | 4/2002 | Cardinale | |
| 7,033,739 B2 | 4/2006 | Goldstein et al. | |
| 7,109,504 B2 | 9/2006 | Chandhok et al. | |
| 7,527,920 B2 | 5/2009 | Goldstein et al. | |
| 7,833,682 B2 | 11/2010 | Hayashi et al. | |
| 2004/0151988 A1 | 8/2004 | Silverman | |
| 2005/0064298 A1 | 3/2005 | Silverman | |
| 2005/0120775 A1 | 6/2005 | Grayfer et al. | |
| 2005/0183490 A1 | 8/2005 | Grayfer et al. | |
| 2006/0093972 A1 | 5/2006 | Goldstein et al. | |
| 2008/0113303 A1 | 5/2008 | Silverman | |

* cited by examiner

*Primary Examiner* — Stephen Rosasco
(74) *Attorney, Agent, or Firm* — Kevin P. Radigan, Esq.; Heslin Rothenberg Farley & Mesiti P.C.

(57) ABSTRACT

Methods are provided for fabricating a process structure, such as a mask or mask blank. The methods include, for instance: providing a silicon substrate; forming a multi-layer, extreme ultra-violet lithography (EUVL) structure over the silicon substrate; subsequent to forming the multi-layer EUVL structure over the crystalline substrate, reducing a thickness of the silicon substrate; and attaching a low-thermal-expansion material (LTEM) substrate to one of the multi-layer EUVL structure, or the reduced silicon substrate. In one implementation, the silicon substrate is a silicon wafer with a substantially defect-free surface upon which the multi-layer EUVL structure is formed. The multi-layer EUVL structure may include multiple bi-layers of a first material and a second material, as well as a capping layer, and optionally, an absorber layer, where the absorber layer is patternable to facilitating forming a EUVL mask from the process structure.

25 Claims, 9 Drawing Sheets

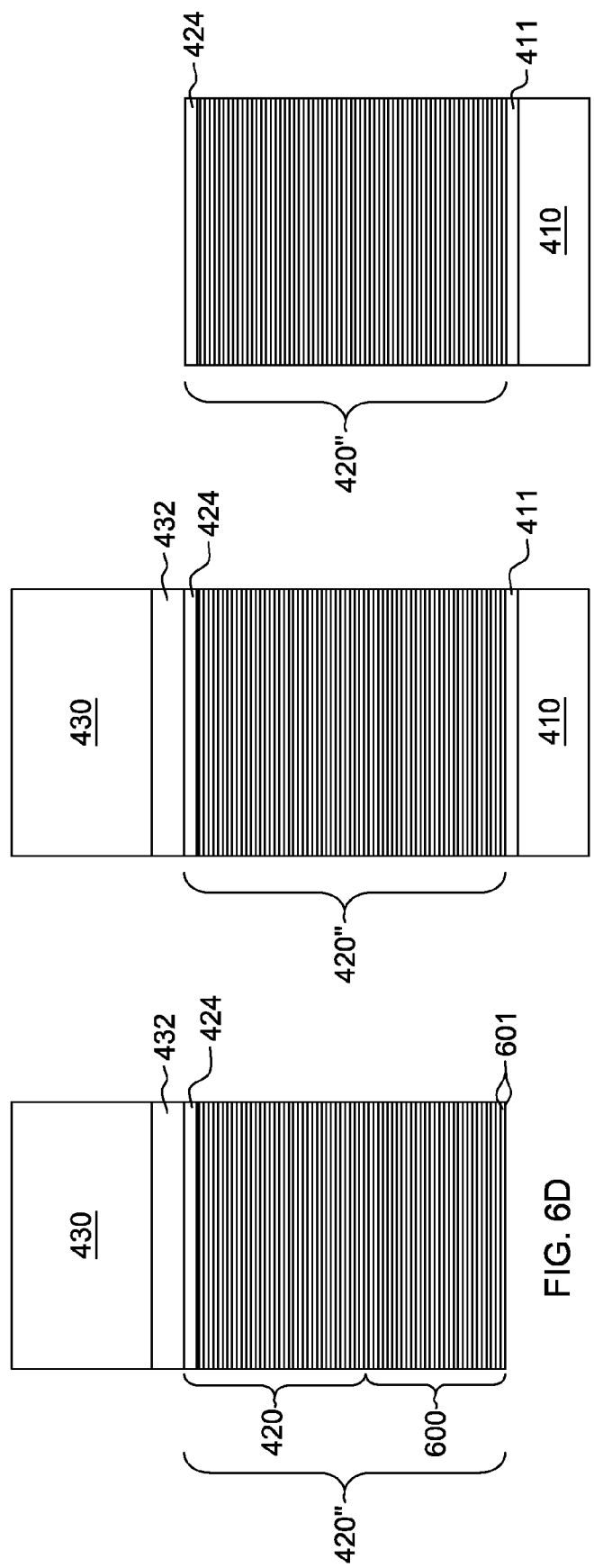

EUVL PROCESS STRUCTURE FABRICATION METHODS

BACKGROUND

This invention relates generally to semiconductor device fabrication, and more particularly, to processes for fabricating a process structure, such as a reticle, mask, mask blank, etc., with reduced defects.

The electronics industry continues to rely on advances in semiconductor technology to realize ever higher-functioning devices in more compact areas. For many applications, realizing higher-functioning devices requires integrating a larger and larger number of electronic devices onto a single wafer. As the number of electronic devices per area of wafer increases, the manufacturing processes become more intricate.

One of the process steps encountered in the fabrication of integrated circuits and other semiconductor devices is photolithography. Generally stated, photolithography includes selectively exposing a specially-prepared wafer surface to a source of radiation using a patterned template to create an etched surface layer. Typically, the patterned template is a reticle, which is a flat, glass plate that contains the patterns to be reproduced on the wafer.

The industry trend towards the production of integrated circuits that are smaller and/or of higher logic density necessitates ever smaller line widths. The resolution with which a pattern can be reproduced on the wafer surface depends, in part, on the wavelength of ultraviolet light used to project the pattern onto the surface of the photoresist-coated wafer. State-of-art photolithography tools use deep, ultraviolet light, with wavelengths of 193 nm, which allow minimum feature sizes on the order of 20 nm. Tools currently being developed use 13.5 nm extreme ultra-violet (EUV) light to permit resolution of features at sizes below 30 nm.

Extreme ultraviolet lithography (EUVL) is a significant departure from the deep, ultraviolet lithography currently in use today. All matter absorbs EUV radiation, and hence, EUV lithography takes place in a vacuum. The optical elements, including the photo-mask, make use of multi-layers, which act to reflect light by means of interlayer interference. With EUV, reflection from the patterned surface is used as opposed to transmission through the reticle characteristic of deep, ultraviolet light photolithography. The reflective photo-mask (reticle) employed in EUV photolithography is susceptible to surface irregularities, contamination and damage to a greater degree than reticles used in conventional photolithography. This imposes heightened requirements on reticle manufacturing destined for EUV photolithography use. For example, any surface irregularity in the reticle could compromise the reticle to a degree sufficient to seriously affect the end product obtained from the use of such a reticle during processing.

BRIEF SUMMARY

In one aspect, the shortcomings of the prior art are overcome and additional advantages are provided through the provision of a method of fabricating a process structure which includes, for instance: providing a silicon substrate; forming a multi-layer, extreme ultra-violet lithography (EUVL) structure over the silicon substrate; reducing, subsequent to forming the multi-layer EUVL structure over the silicon substrate, a thickness of the silicon substrate; and attaching a low-thermal-expansion material (LTEM) substrate to one of the multi-layer EUVL structure, or the reduced, silicon substrate.

In another aspect, a method of fabricating a process structure is provided which includes, for instance: providing a silicon substrate; forming a multi-layer extreme ultra-violet lithography (EUVL) structure over the silicon substrate, the EUVL structure comprising multiple bi-layers and a capping layer; reducing, subsequent to forming the multi-layer EUVL structure over the silicon substrate, the thickness of the silicon substrate; and attaching a low-thermal-expansion material (LTEM) substrate to one of the multi-layer EUVL structure, or the reduced silicon substrate.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIGS. 6A-6F depict a further embodiment of a method of fabricating a process structure with reduced defects and low-thermal-expansion, in accordance with one or more aspects of the present invention;

DETAILED DESCRIPTION

The present invention and various aspects and advantages of the invention are explained more fully with reference to the non-limiting embodiments illustrated in the accompanying drawings. Descriptions of well-known starting materials, processing techniques, components, and equipment, are omitted so as not to unnecessarily obscure the invention in detail. It should be understood, however, that the detailed description and examples presented, while indicating embodiments of the invention, are given by way of illustration only, and not by way of limitation. Various substitutions, modifications, and/or rearrangements within the spirit and/or scope of the underlying inventive concepts will be apparent to those skilled in the art from this disclosure.

As noted, the reflective photo-mask (reticle) employed in EUV photolithography is susceptible to surface irregularity problems and contamination to a greater degree than reticles used in conventional photolithography. This imposes heightened requirements on reticle manufacturing destined for EUV photolithography use. For example, any irregularities or particle contamination of the one or more surfaces of a reticle could compromise the reticle to a degree sufficient to seriously affect the end product obtained from the use of such a reticle during processing. Thus, addressed hereinbelow, in one aspect, is the issue of surface irregularities and/or particle contamination of a starting surface during process structure fabrication. As used herein, a "process structure" means any of a variety of structures, including a reticle, a mask, a mask blank, etc., to be used, for instance, in a lithography process.

Reference is made below to the drawings (which are not drawn to scale for ease of understanding), wherein the same reference numbers used throughout different figures designate the same or similar components.

Figure 1:
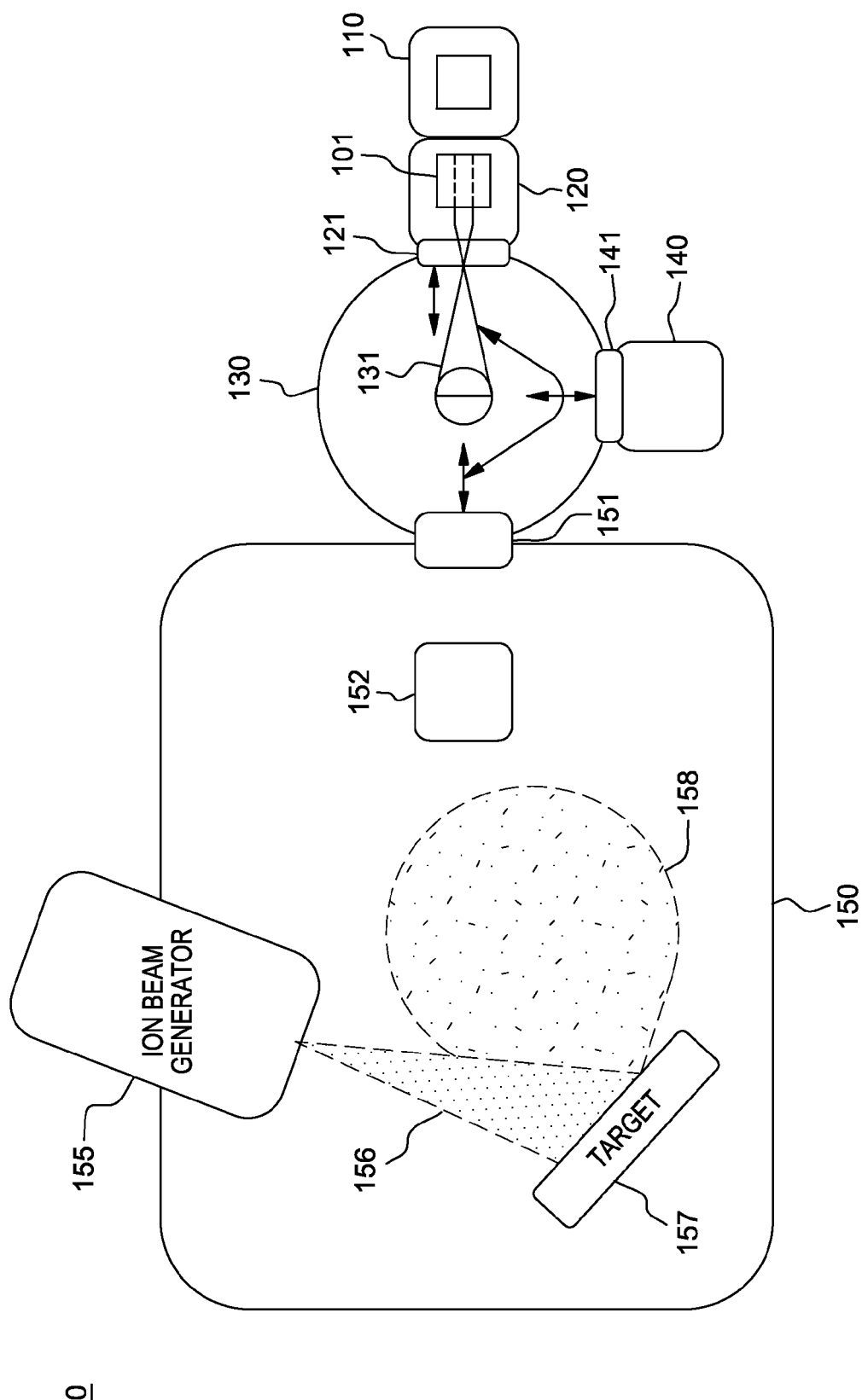
FIG. 1 is a schematic of one embodiment of a fabrication facility for fabricating a process structure, such as a mask or mask blank, which facilitates (for instance) semiconductor device fabrication.

FIG. 1 depicts one embodiment of a fabrication facility, generally denoted 100, comprising multiple chambers employed in the fabrication of a process structure 101, such as an EUV mask. The multiple chambers include (by way of example) a holder chamber 110, a removal chamber 120, a robotic arm transfer chamber 130, a laser alignment chamber 140, and a deposition chamber 150. Process structure 101 is removed via a robotic arm 131 from holder chamber 110, through an isolation door 121 of removal chamber 120. Robotic arm 131 retracts the process structure 101 into the robotic arm transfer chamber 130, rotates the structure, and extends the structure into the laser alignment chamber 140, through an isolation door 141 of laser alignment chamber 140. In the laser alignment chamber, the robotic arm manipulates the location of the process structure to allow laser alignment to precisely identify where the process structure is located on the robotic arm in order that repeatable depositions may occur. The robotic arm 131 then repositions the process structure 101 at the vacuum isolation door 151 of deposition chamber 150. Vacuum isolation door 151 is opened, and process structure 101 is placed onto a support structure 152, which by way of example, may comprise a mechanical or electrostatic chuck. Once the support structure 152 is engaged to clamp or hold process structure 101, robotic arm 131 is retracted, and vacuum isolation door 151 is closed. Deposition chamber 150 conditions are set or manipulated for a desired deposition process and deposition processing proceeds, wherein multi-layer features may be deposited onto process structure 101. Specifically, by way of example, an ion beam generator 155 generates an ion beam 156, which impinges on a target 157, and results in a deposition plume 158 within process chamber 150. The deposition plume 158 is controlled so that the desired layer(s) is deposited onto process structure 101. After deposition is complete, support structure 152 (for example, electrostatic chuck) is disengaged, allowing the robotic arm 131 to remove process structure 101, and relocate the structure to the holder chamber 110.

As noted, extreme ultra-violet lithography (EUVL) is a leading candidate for next-generation lithographic systems for fabrication of semiconductor devices or circuits. One key difference between EUVL and conventional lithography is that EUVL employs 13.4 nm light, and therefore requires reflective optics coated with multi-layers. Typically, the multi-layers comprise alternating layers of a first material and a second material, such as molybdenum and silicon. Each pair of alternating layers is referred to as a bi-layer, with the multi-layer EUVL structure typically comprising a specified number of bi-layers, for instance, 40 bi-layers.

Deposition of low-defect, uniform multi-layer coatings on mask blanks is an area of intense development. Additionally, thermal management of EUVL masks (or substrates) is an important field. For instance, low-thermal-expansion material (LTEM) substrates, or ultra-low-expansion (ULE) substrates, such as glass substrates, have thermal coefficient advantages compared with conventional silicon substrates, and are being considered for the thermal management in EUVL process structures. Also, the vast experience in fabrication and processing, including defect detection and classification results that have been obtained using silicon substrate materials, render silicon a desirable material for EUVL mask fabrication. Since mask blank defect inspection is one of the most important factors in determining mask blank yield, and as a consequence of costs, the use of silicon during the fabrication of EUV process structures is valuable.

Disclosed herein are various approaches to producing process structures which incorporate thermal coefficient advantages of low-thermal-expansion material substrates, and the defect avoidance and detection advantages of silicon.

FIGS. 2A-2E depict one implementation of this concept, wherein a silicon wafer is bonded to a low-thermal-expansion material wafer, and the silicon is thinned to a thickness of about, for instance, 5-10 micrometers. Various techniques for bonding silicon wafers to silicon or other materials are known in the art, and include thermal compression, anodic, etc. The bonding of silicon to a substrate can also be carried out at various temperatures, including room temperature bonding. By combining the advantages of LTEM substrates and silicon surfaces, thermal management and defect inspection and avoidance problems for EUVL process structures can be resolved, or greatly reduced. Note that low-thermal-expansion material is employed herein to mean a material with a coefficient of thermal expansion<100 ppk/° K, and may comprise a selected glass, plastic, or ceramic material.

Figure 2A:
FIGS. 2A-2E depict one embodiment of a process for fabricating a process structure, in accordance with one or more aspects of the present invention.
Figure 2B:
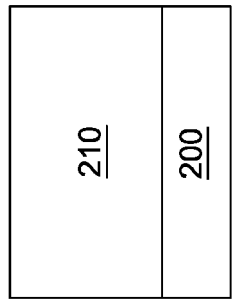
Figure 2C:
Figure 2D:
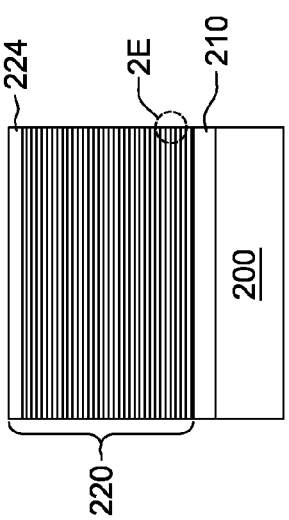
Figure 2E:
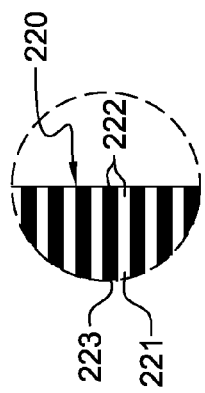

Referring collectively to FIGS. 2A-2E, in this fabrication approach, processing begins with a low-thermal-expansion material (LTEM) substrate 200 (FIG. 2A), to which a silicon wafer 210 is bonded (FIG. 2B). In one implementation, the silicon wafer 210 and LTEM substrate 200 may comprise the same diameter, for instance, about 8 inches in diameter. The LTEM substrate 200 may have a thickness of about 0.25 inches, and the silicon wafer a thickness of about 600-800 micrometers (although the thickness of the LTEM wafer may vary from, for instance, 0.2 inches to about 0.5 inches). Bonding of the silicon substrate 210 to the LTEM substrate may employ any conventional bonding technique, such as anodic, thermal compression, room temperature, etc., each of which is commonly known in integrated circuit fabrication. The silicon substrate is subsequently ground and polished using, for instance, chemical and mechanical polishing, to a thickness of approximately 5-10 micrometers, as illustrated in FIG. 2C. Next, a multi-layer, extreme ultra-violet lithography (EUVL) structure 220 is formed over the reduced silicon substrate 210. This multi-layer EUVL structure 220 includes, for instance, multiple bi-layers 222, and a capping layer 224 (as shown in FIG. 2D). As shown in the partially enlarged view of FIG. 2E, a bi-layer 222 comprises, for instance, a first layer 221 of a first material, and a second layer 223 of a second material. As noted, in one specific example, the first material and second material may comprise molybdenum and silicon.

Unfortunately, the fabrication process depicted in FIGS. 2A-2E may have certain drawbacks. For instance, after the bonding to and thinning of the silicon substrate on the LTEM substrate, the exposed silicon surface, above which the multi-layer EUVL structure is to be formed, may have defects or irregularities resulting from the thinning process. These defects or irregularities can inhibit fabrication of a defect-free process structure, such as a mask blank. Additionally, depending on the process structure attribute(s) desired, 10 microns of silicon remaining between the multi-layer EUVL structure and the LTEM substrate may be problematic.

In view of these potential drawbacks, alternate fabrication solutions to the above-noted approach are described hereinbelow with reference to FIGS. 3-8D. In each of these approaches, the multi-layer, extreme ultra-violet lithography (EUVL) structure is formed over a substantially defect-free, pristine silicon substrate or wafer, prior to any thinning or etching of the silicon substrate. This advantageously ensures that the surface of the silicon substrate upon which the multi-layer EUVL structure is formed, is substantially free of defects or irregularities, which may otherwise result from the thinning of the silicon substrate.

Figure 3:
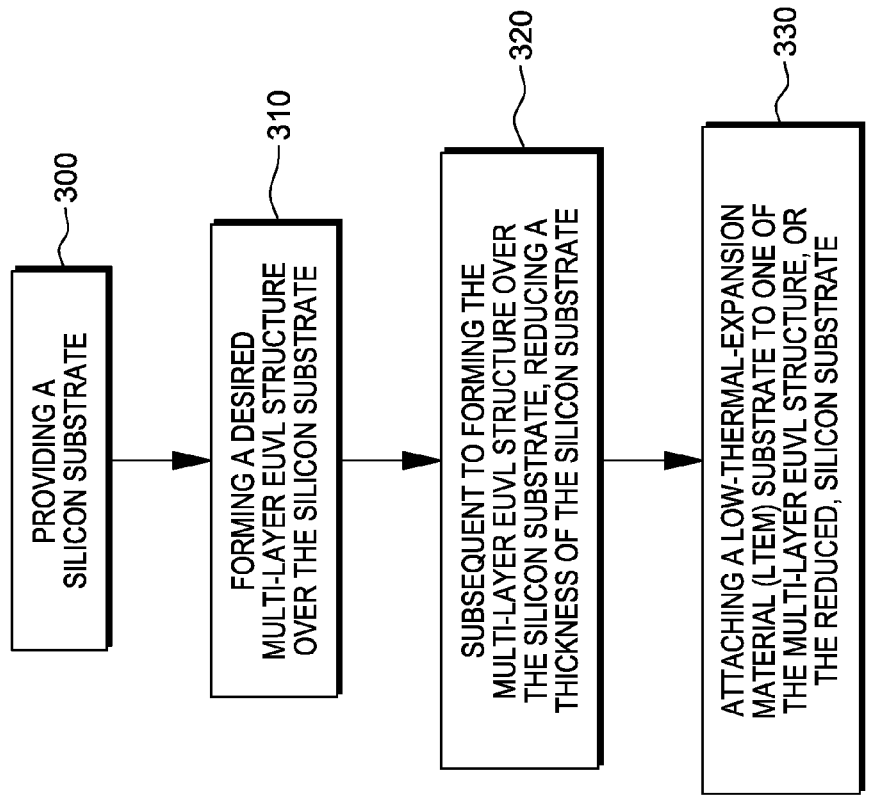
FIG. 3 depicts an overview of an enhanced approach to fabricating a process structure with reduced defects and low-thermal-expansion, in accordance with one or more aspects of the present invention.

These alternate fabrication solutions are generally outlined in FIG. 3, wherein: a process structure is fabricated by providing a silicon substrate 300 (such as a crystalline silicon substrate, a polycrystalline silicon substrate, or an amorphous silicon substrate), forming a desired multi-layer EUVL structure over the silicon substrate 310; and subsequent to forming the multi-layer EUVL structure over the silicon substrate, then reducing a thickness of the silicon substrate 320. Note that as used herein, and as explained by the examples described below, "reducing" the silicon substrate may comprise thinning the silicon substrate, or alternatively, removing the silicon substrate, for instance, by thinning the silicon substrate, and then etching away the thinned silicon substrate. The alternate fabrication solutions also include attaching a low-thermal-expansion material (LTEM) substrate to either the multi-layer EUVL structure, or to the reduced silicon substrate 330. Specific embodiments of these solutions are described below (by way of example only) with reference to FIGS. 4A-8D.

Figure 4C:
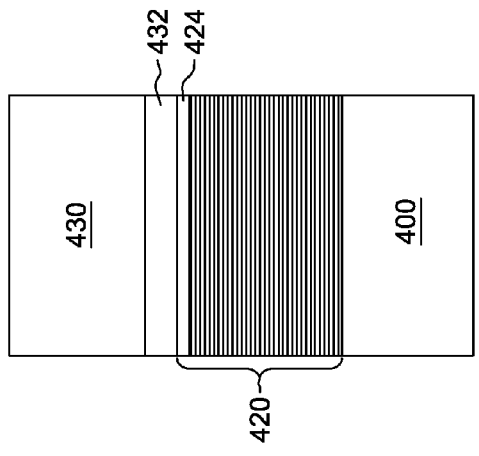
FIGS. 4A-4F depict one embodiment of a method of fabricating a process structure with reduced defects and low-thermal-expansion, in accordance with one or more aspects of the present invention.
Figure 4D:
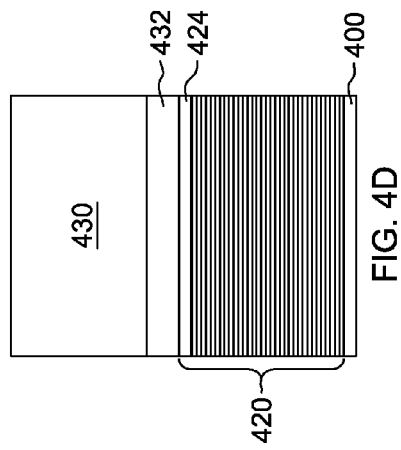
Figure 4B:
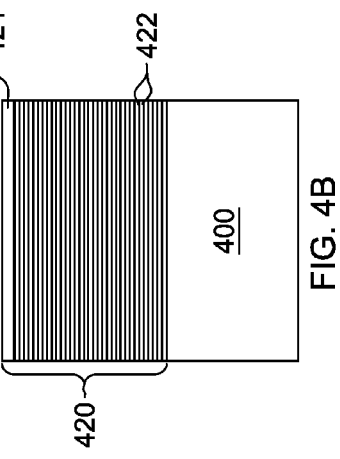
Figure 4E:
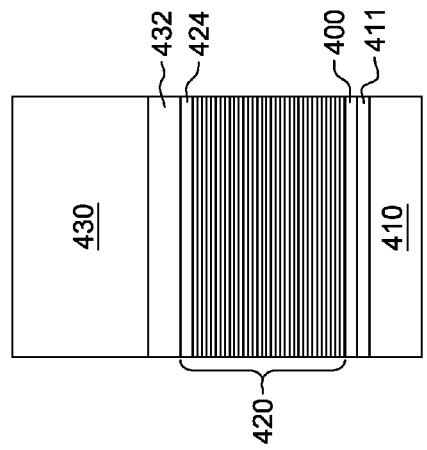
Figure 4A:
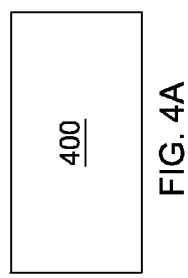
Figure 4F:
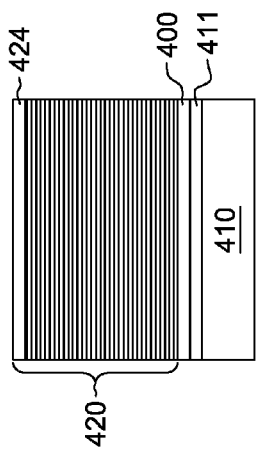

Referring first to the fabrication approach of FIGS. 4A-4F, process structure fabrication begins with provision of a silicon substrate 400 (FIG. 4A), which may comprise a 600-800 micron thick silicon wafer. A multi-layer, extreme ultra-violet lithography (EUVL) structure 420 is then formed over the silicon substrate 400 (as shown in FIG. 4B). As one example, the multi-layer EUVL structure 420 may comprise a specified number of bi-layers 422 (e.g., 40) of alternating first and second material layers, such as molybdenum and silicon layers, capped with a capping layer 424, such as a layer of ruthenium. In one implementation, the multi-layer EUVL structure 420 may be grown on the silicon substrate 400 employing a fabrication facility, such as described above in connection with FIG. 1.

As shown in FIG. 4C, after the multi-layer EUVL structure 420 has been formed, a carrier 430, such as a silicon carrier wafer, is bonded to the multi-layer EUVL structure 420 employing a sacrificial layer 432, such as a photoresist attach. Note in this regard that, any known technique for 300 mm wafer and tools may be employed to bond carrier 430 to the multi-layer EUVL structure 420. Next, as shown in FIG. 4D, the silicon substrate 400 is reduced (or thinned), for instance, using any of various known techniques for polishing silicon, down to, for instance, 5-10 micrometers. The low-thermal-expansion material (LTEM) substrate 410 is then attached or bonded 411 to the thinned silicon substrate 400 (FIG. 4E), after which the carrier 430 is released by removing the sacrificial layer 432 to produce the resultant process structure depicted in FIG. 4F, wherein the multi-layer EUVL structure 420 resides over a thinned silicon substrate 400, which is attached to a low-thermal-expansion material substrate 410. Advantageously, using the fabrication solution of FIGS. 4A-4F, the multi-layer EUVL structure is formed above a pristine, conventional silicon substrate or wafer, that is, before any thinning or reducing of the wafer, which ensures a more regular and defect-free surface upon which to form the multi-layer EUVL structure 420.

Figure 5D:
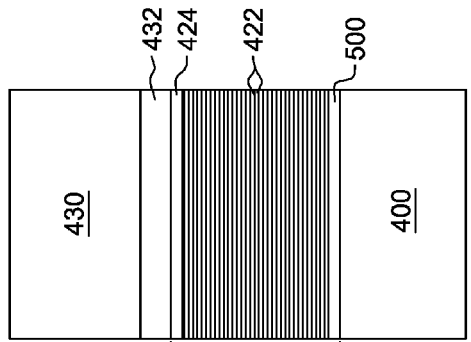
FIGS. 5A-5G depict another embodiment of a method of fabricating a process structure with reduced defects and low-thermal-expansion, in accordance with one or more aspects of the present invention
Figure 5C:
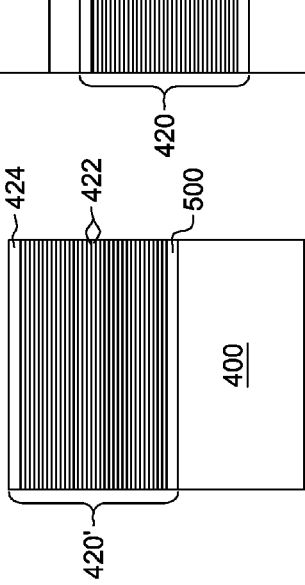
Figure 5B:
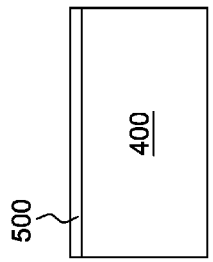
Figure 5A:
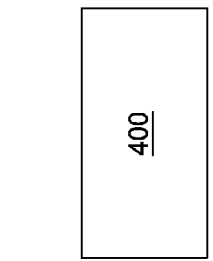
Figure 5E:
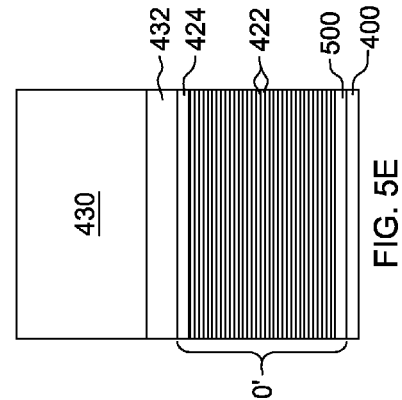
Figure 5F:
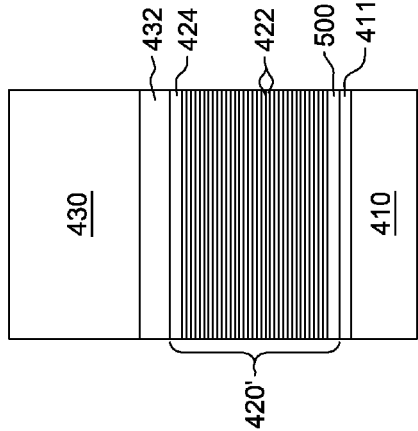
Figure 5G:
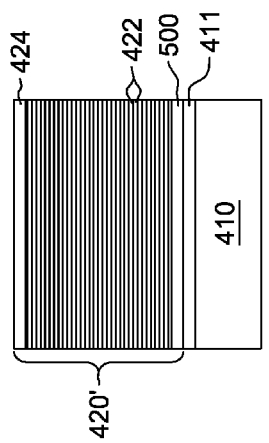

FIGS. 5A-5G depict a variation on the fabrication process of FIGS. 4A-4F. In this approach, an etch stop layer 500 (FIG. 5B) is initially provided over the silicon substrate or wafer 400 (FIGS. 5A & 5B). This etch stop layer is selected to resist etching when removing silicon, and in one implementation, may be grown, and comprise, for instance, silicon dioxide or silicon nitride. The multiple bi-layers 422, and capping layer 424, are then formed to complete the multi-layer EUVL structure 420', which in this embodiment, includes etch stop layer 500. Processing then proceeds as described above in connection with FIGS. 4A-4F, wherein a carrier 430 (FIG. 5C), such as a silicon carrier wafer, is temporarily attached (for instance, via a sacrificial resist 432) to the multi-layer EUVL structure 420'.

After attaching the carrier, the silicon substrate 400 may be thinned down to, for instance, 5-10 micrometers, using various known techniques, for instance, for 300 mm wafer fabrication. After thinning (or polishing) the silicon substrate 400, the remaining 5-10 micrometers may be etched chemically away, with etch stop layer 500 preventing any further etching, and protecting the bi-layers 422 of multi-layer EUVL structure 420' (see FIG. 5E). After etching away the silicon substrate, the multi-layer EUVL structure 420' may be bonded 411 to an LTEM substrate 410 (FIG. 5F), and after attaching the LTEM substrate 410, the carrier 430 is released, with the resultant structure depicted in FIG. 5G.

Figure 6C:
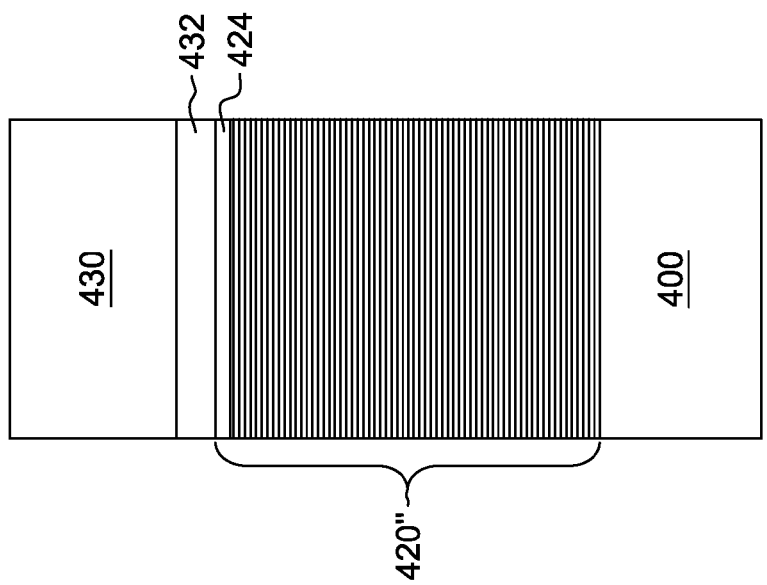
Figure 6B:
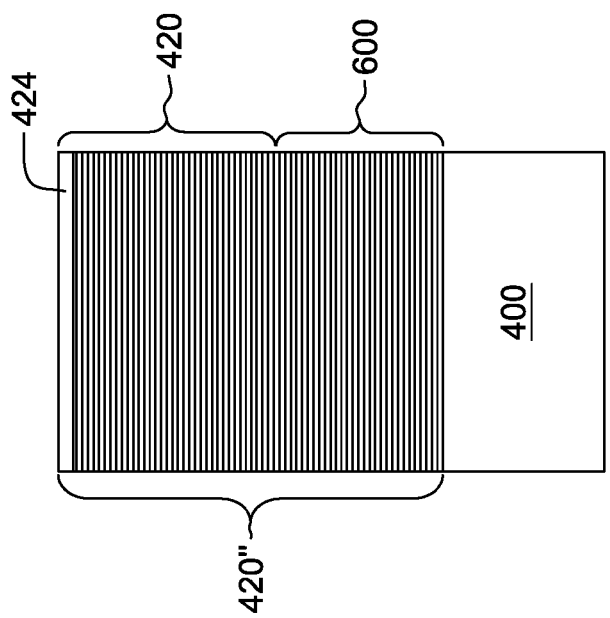
Figure 6A:
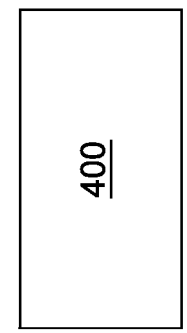

FIGS. 6A-6F depict an alternate fabrication approach to that described above in connection with FIGS. 4A-5F. In this embodiment, the etch stop layer 500 of the above-described process structure fabrication approach of FIGS. 5A-5G, is replaced with a buffer 600. In the embodiment of FIGS. 6A-6F, buffer 600 comprises multiple extra bi-layers than required for a specified, multi-layer EUVL structure 420. The modified multi-layer EUVL structure 420", with buffer 600 comprising multiple extra bi-layers, is formed, for instance, by deposition processes, over the silicon substrate 400 (FIGS. 6A & 6B). The carrier 430 is then temporarily attached via a sacrificial attach layer 432 to modified multi-layer EUVL structure 420" (FIG. 6C). After attaching the carrier, the silicon substrate 400 is thinned, for instance, to 5-10 micrometers, such as in the approaches described above, and thereafter etched away, with the buffer 600 providing separation between the etching of the silicon and the specified, multi-layer EUVL structure 420 (see FIG. 6D). By way of example, if the specified, multi-layer EUVL structure requires 40 bi-layers, then the buffer may comprise an extra 20-40 bi-layers (or more), so that with the subsequent etching away of the thinned silicon substrate, to any extent that the multi-layer EUVL structure 420" is impacted, only effects bi-layers 601 closest to the silicon, and not the specified, multi-layer EUVL structure 420 (and thus does not affect operation of the resultant process structure). After etching away the thinned silicon, the LTEM substrate 410 is bonded 411 to the modified, multi-layer EUVL structure 420" (FIG. 6E), and the carrier 430 is released, with the resultant structure depicted in FIG. 6F. Note that in this embodiment, the extra bi-layers function as a buffer, and comprise cushioning (or sacrificial layers), which may be impacted by the etching of the silicon substrate. However, a sufficient number of extra bi-layers 600 are provided so as to ensure that the etching does not impact the specified, multi-layer EUVL structure 420.

Figure 7A:
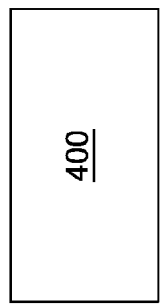
FIGS. 7A-7E depict another embodiment of a method of fabricating a process structure with reduced defects and low-thermal-expansion, in accordance with one or more aspects of the present invention.
Figure 7B:
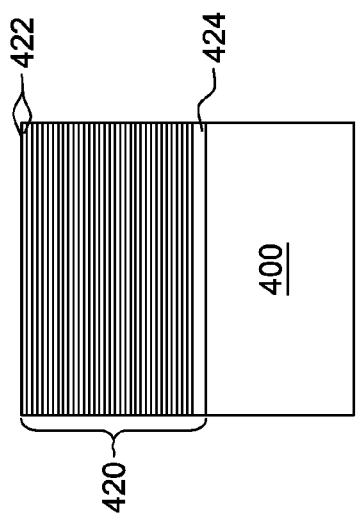
Figure 7C:
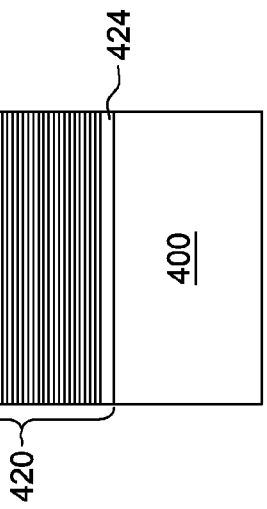
Figure 7D:
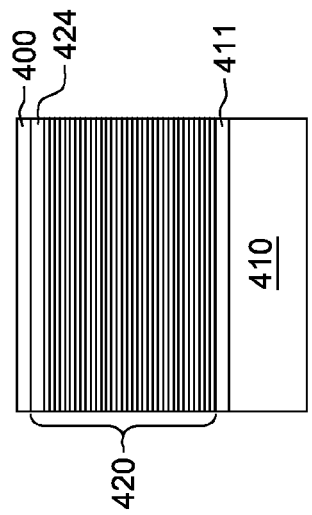
Figure 7E:
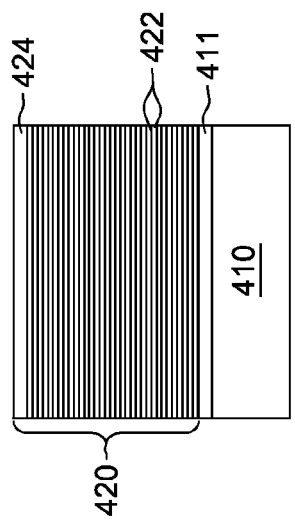
Figure 8A:
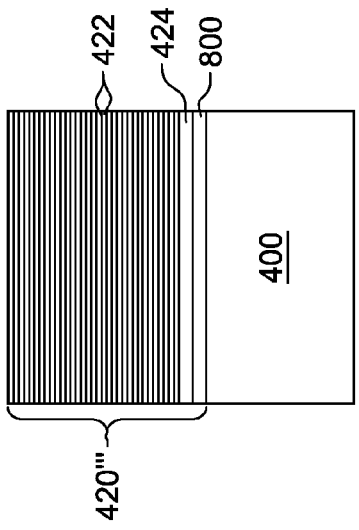
FIGS. 8A-8D depict a further embodiment of a method of fabricating a process structure with reduced defects and low-thermal-expansion, in accordance with one or more aspects of the present invention.
Figure 8B:
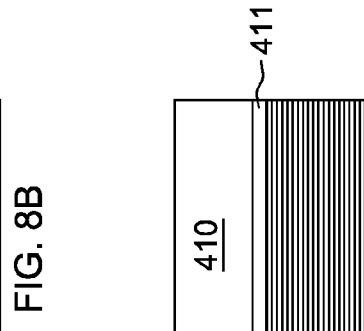
Figure 8C:
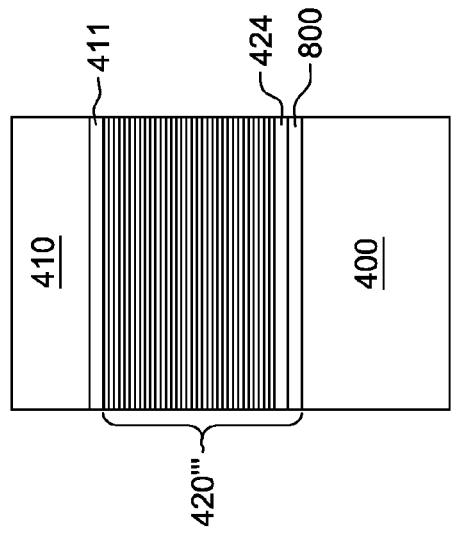
Figure 8D:
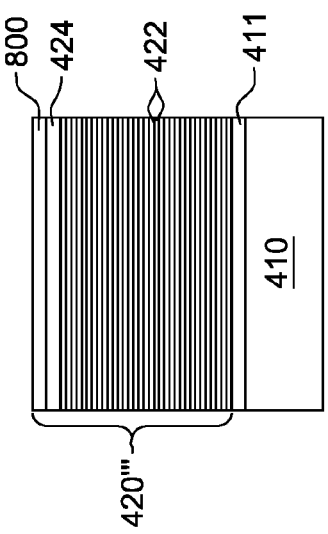

FIGS. 7A-7E depict another fabrication approach, in accordance with one or more aspects of the present invention. This approach begins with a conventional silicon substrate (or wafer) 400, as shown in FIG. 7A, upon which the multi-layer EUVL structure 420 is formed inverted over the silicon substrate 400 (see FIG. 7B). That is, in this approach, capping layer 424 is first grown or deposited over silicon substrate 400, followed by a desired number of bi-layers 422 required to create the multi-layer EUVL structure 420. As shown in FIG. 7C, the low-thermal-expansion material substrate 410 is then bonded 411 directly to the exposed surface of the multi-layer EUVL structure 420, after which the silicon substrate 400 is thinned (FIG. 7D), for example, by conventional polishing, down to, for instance, 5-10 micrometers. The thinned silicon substrate is then etched away, with capping layer 424 functioning as an etch stop layer. The resultant process structure is depicted in FIG. 7E.

FIGS. 8A-8D depict a variation on the fabrication approach of FIGS. 7A-7E, wherein the formed, inverted, multi-layer EUVL structure 420''' (FIG. 8B) includes an absorber layer 800 over the silicon substrate 400 (FIGS. 8A & 8B), between the substrate 400 and capping layer 424, above which the desired number of bi-layers 422 are provided. The low-thermal-expansion material (LTEM) substrate 410 is then bonded 411 directly to the exposed surface of the inverted, multi-layer EUVL structure 420'''. After attaching the LTEM substrate 410 (FIG. 8C), the silicon substrate 400 may be thinned, for example, by polishing, and then etched away, with the absorber layer 800 functioning as an etch stop layer in the etching process. Advantageously, absorber layer 800 is selected so as to be patternable to facilitate forming a desired EUVL mask, using the resultant process structure.

Note that the addition of an absorber layer 800 may also be employed in any of the fabrication approaches described above in connection with FIGS. 4A-7E. For instance, in the fabrication approach of FIGS. 4A-4F, an absorber layer (not shown) could be added over capping layer 424 prior to temporary attachment of carrier 430, and subsequent thinning of the silicon substrate. Once the LTEM substrate 410 is attached, and the carrier is removed, the absorber layer would already reside within the multi-layer EUVL structure, and be ready for patterning to facilitate producing a desired EUVL mask.

Advantageously, a silicon wafer can be provided with an exposed surface which has substantially fewer defects, compared with (for example) quartz or other LTEM substrates, or even compared with a thinned silicon substrate, such as in the embodiment of FIGS. 2A-2D. The cleaning of a silicon wafer is well known, and advanced, which produces advantages over using an LTEM substrate only. Providing the multi-layer EUVL structure over a silicon substrate or wafer is thus more advantageous, and in the processes described herein, the thickness of the silicon substrate is subsequently reduced, or even etched away, prior to, or even after, attachment of the LTEM substrate to the multi-layer EUVL structure.

Those skilled in the art will note from the above discussion that the processes described herein facilitate reduction in defects during, for instance, EUVL mask blank deposition processing, while still allowing for a low-thermal-expansion material substrate to be employed. The deposition of defect-free mask blanks is currently one of the main challenges in EUV lithography.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention.

What is claimed is:

1. A method of fabricating a process structure comprising:
   providing a silicon substrate;
   forming a multi-layer, extreme ultra-violet lithography (EUVL) structure over the silicon substrate;
   reducing, subsequent to forming the multi-layer EUVL structure over the silicon substrate, a thickness of the silicon substrate; and
   attaching a low-thermal-expansion material (LTEM) substrate to one of the multi-layer EUV structure, or the reduced, silicon substrate.

2. The method of claim 1, further comprising attaching a carrier to the multi-layer EUVL structure using a sacrificial layer, wherein the reducing comprises polishing the silicon substrate down to a thickness of 50 microns or less.

3. The method of claim 2, wherein the forming comprises providing the multi-layer EUV structure with a capping layer, and the attaching of the carrier comprises temporarily attaching the carrier to the capping layer utilizing the sacrificial layer.

4. The method of claim 3, wherein the attaching the carrier occurs subsequent to forming of the multi-layer EUVL structure, and prior to reducing the thickness of the silicon substrate, and wherein the method further comprises removing the carrier subsequent to attaching the LTEM substrate to the one of the multi-layer EUVL structure, or the reduced silicon substrate.

5. The method of claim 3, wherein the capping layer comprises a layer of ruthenium, and the sacrificial layer comprises a layer of resist material, and wherein the carrier comprises a silicon carrier wafer.

6. The method of claim 2, wherein the forming comprises providing the multi-layer EUVL structure with an absorber layer, the absorber layer being patternable to facilitate forming a EUVL mask from the process structure, and the attaching of the carrier comprises temporarily attaching the carrier to the absorber layer using the sacrificial layer.

7. The method of claim 1, wherein the multi-layer EUVL structure further comprises, in part, an etch stop layer disposed over the silicon substrate, and the reducing comprises thinning the silicon substrate, and then etching the silicon substrate away to expose the etch stop layer, and the attaching comprises attaching the LTEM substrate to the exposed etch stop layer.

8. The method of claim 7, further comprising attaching a carrier to the multi-layer EUVL structure using a sacrificial layer, the attaching the carrier occurring prior to the reducing of the silicon substrate.

9. The method of claim 8, wherein the forming comprises providing the multi-layer EUVL structure with a capping layer, and the attaching the carrier comprises temporarily attaching the carrier to the capping layer using the sacrificial layer.

10. The method of claim 8, wherein the forming comprises providing the multi-layer EUVL structure with an absorber layer, the absorber layer being patternable to facilitate forming a EUVL mask from the process structure, and the attaching the carrier comprising temporarily attaching the carrier to the absorber layer using the sacrificial layer.

11. The method of claim 1, wherein the multi-layer EUVL structure comprises a specified multi-layer EUVL structure formed over a buffer, the buffer being disposed between the silicon substrate and the specified multi-layer EUVL structure.

12. The method of claim 11, wherein the specified multi-layer EUVL structure comprises a specified number of bi-layers, and wherein the buffer comprises multiple extra bi-layers.

13. The method of claim 11, wherein the method further comprises temporarily attaching a carrier to the multi-layer EUVL structure using a sacrificial layer, and the reducing of the silicon substrate comprises removing the silicon substrate from the multi-layer EUVL structure, and the attaching of the LTEM comprises attaching the LTEM substrate to the multi-layer EUVL structure, and subsequently detaching the carrier from the multi-layer EUVL structure.

14. The method of claim 13, wherein the forming comprises providing the multi-layer EUVL structure with a capping layer, and the temporarily attaching comprises temporarily attaching the carrier to the capping layer using the sacrificial layer.

15. The method of claim 13, wherein the forming comprises providing the multi-layer EUVL structure with an absorber layer, the absorber layer being patternable to facilitating forming a EUVL mask from the process structure, and the temporarily attaching comprises temporarily attaching the carrier to the absorber layer using the sacrificial layer.

16. The method of claim 1, wherein the attaching the LTEM substrate comprises attaching the LTEM substrate to the multi-layer EUVL structure, and the reducing comprises subsequently removing the silicon substrate from the multi-layer EUVL structure.

17. The method of claim 16, wherein the forming comprises providing the multi-layer EUVL structure with a capping layer disposed over the silicon substrate, and wherein the removing of the silicon substrate from the multi-layer EUVL structure exposes the capping layer.

18. The method of claim 16, wherein the forming comprises providing the multi-layer EUVL structure with an absorber layer disposed over the silicon substrate, and a capping layer disposed over the absorber layer, the absorber layer being patternable to facilitating forming a EUVL mask from the process structure, and wherein the absorber layer is disposed between the capping layer and the silicon substrate, and wherein the removing of the silicon substrate exposes the absorber layer.

19. A method of fabricating a process structure comprising:
providing a silicon substrate;
forming a multi-layer, extreme ultra-violet lithography (EUVL) structure over the silicon substrate, the EUVL structure comprising multiple bi-layers and a capping layer;
reducing, subsequent to forming of the multi-layer EUVL structure over the silicon substrate, the thickness of the silicon substrate; and
attaching a low-thermal-expansion material (LTEM) substrate to one of the multi-layer EUVL structure, or the reduced silicon substrate.

20. The method of claim 19, wherein a bi-layer of the multiple bi-layers comprises a layer of a first material, and a layer of a second material, the first material and the second material being different materials.

21. The method of claim 20, wherein the first material comprises molybdenum, and the second material comprises silicon, and wherein the capping layer comprises ruthenium.

22. The method of claim 19, further comprising providing an etch stop layer over the silicon substrate, and wherein the reducing comprises thinning the silicon substrate, and then etching away the thinned, silicon substrate to expose the etch stop layer.

23. The method of claim 19, wherein the multi-layer EUVL structure comprises a specified, multi-layer EUVL structure formed over a buffer, the buffer being disposed between the silicon substrate and the specified, multi-layer EUVL structure, and wherein the specified, multi-layer EUVL structure comprises a specified number of bi-layers, and the buffer comprises multiple extra bi-layers.

24. The method of claim 19, wherein the forming of the multi-layer EUVL structure comprises forming the multi-layer EUVL structure inverted over the silicon substrate, and wherein the attaching comprises attaching the LTEM substrate to an exposed layer of the multi-layer EUVL structure.

25. The method of 19, further comprising providing the multi-layer EUVL structure with an absorber layer, the absorber layer being patternable to facilitating forming a EUVL mask from the process structure.

* * * * *